United States Patent
Li

(10) Patent No.: US 11,476,874 B1
(45) Date of Patent: Oct. 18, 2022

(54) METHOD AND SYSTEM FOR FACILITATING A STORAGE SERVER WITH HYBRID MEMORY FOR JOURNALING AND DATA STORAGE

(71) Applicant: Alibaba Singapore Holding Private Limited, Singapore (SG)

(72) Inventor: Shu Li, Bothell, WA (US)

(73) Assignee: Alibaba Singapore Holding Private Limited, Singapore (SG)

( * ) Notice: Subject to any disclaimer, the term of this patent is extended or adjusted under 35 U.S.C. 154(b) by 0 days.

(21) Appl. No.: 17/320,970

(22) Filed: May 14, 2021

(51) Int. Cl.
  *H03M 13/00* (2006.01)
  *H03M 13/15* (2006.01)
  *G06F 3/06* (2006.01)

(52) U.S. Cl.
  CPC ...... *H03M 13/6312* (2013.01); *G06F 3/0619* (2013.01); *G06F 3/0652* (2013.01); *G06F 3/0659* (2013.01); *G06F 3/0683* (2013.01); *H03M 13/154* (2013.01)

(58) Field of Classification Search
  CPC .... G06F 3/0619; G06F 3/0652; G06F 3/0659; G06F 3/0683; H03M 13/154; H03M 13/6312
  See application file for complete search history.

(56) References Cited

U.S. PATENT DOCUMENTS

| | | |
|---|---|---|
| 3,893,071 A | 7/1975 | Bossen |
| 4,562,494 A | 12/1985 | Bond |
| 4,718,067 A | 1/1988 | Peters |
| 4,775,932 A | 10/1988 | Oxley |
| 4,858,040 A | 8/1989 | Hazebrouck |

(Continued)

FOREIGN PATENT DOCUMENTS

| | | |
|---|---|---|
| JP | 2003022209 | 1/2003 |
| JP | 2011175422 | 9/2011 |

(Continued)

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — Esaw T Abraham
(74) *Attorney, Agent, or Firm* — Yao Legal Services, Inc.; Shun Yao

(57) ABSTRACT

One embodiment provides a system which facilitates data management. During operation, the system receives, by a first memory device, data to be written to a first non-volatile memory of the first memory device and to a second non-volatile memory of a storage drive distinct from the first memory device. The system performs, by the first memory device on the received data, a compression operation and erasure code (EC)-encoding to obtain a compressed EC codeword. The system initiates a first write operation and a second write operation in parallel, wherein the first write operation comprises writing a first part of the compressed EC codeword to the first non-volatile memory, and wherein the second write operation comprises writing the first part of the compressed EC codeword to the second non-volatile memory.

20 Claims, 9 Drawing Sheets

(56) References Cited

U.S. PATENT DOCUMENTS

| | | |
|---|---|---|
| 5,394,382 A | 2/1995 | Hu |
| 5,602,693 A | 2/1997 | Brunnett |
| 5,715,471 A | 2/1998 | Otsuka |
| 5,732,093 A | 3/1998 | Huang |
| 5,802,551 A | 9/1998 | Komatsu |
| 5,930,167 A | 7/1999 | Lee |
| 6,098,185 A | 8/2000 | Wilson |
| 6,148,377 A | 11/2000 | Carter |
| 6,226,650 B1 | 5/2001 | Mahajan et al. |
| 6,243,795 B1 | 6/2001 | Yang |
| 6,457,104 B1 | 9/2002 | Tremaine |
| 6,658,478 B1 | 12/2003 | Singhal |
| 6,795,894 B1 | 9/2004 | Neufeld |
| 7,351,072 B2 | 4/2008 | Muff |
| 7,565,454 B2 | 7/2009 | Zuberi |
| 7,599,139 B1 | 10/2009 | Bombet |
| 7,953,899 B1 | 5/2011 | Hooper |
| 7,958,433 B1 | 6/2011 | Yoon |
| 8,085,569 B2 | 12/2011 | Kim |
| 8,144,512 B2 | 3/2012 | Huang |
| 8,166,233 B2 | 4/2012 | Schibilla |
| 8,260,924 B2 | 9/2012 | Koretz |
| 8,281,061 B2 | 10/2012 | Radke |
| 8,452,819 B1 | 5/2013 | Sorenson, III |
| 8,516,284 B2 | 8/2013 | Chan |
| 8,527,544 B1 | 9/2013 | Colgrove |
| 8,751,763 B1 | 6/2014 | Ramarao |
| 8,819,367 B1 | 8/2014 | Fallone |
| 8,825,937 B2 | 9/2014 | Atkisson |
| 8,832,688 B2 | 9/2014 | Tang |
| 8,868,825 B1 | 10/2014 | Hayes |
| 8,904,061 B1 | 12/2014 | O'Brien, III |
| 8,949,208 B1 | 2/2015 | Xu |
| 9,015,561 B1 | 4/2015 | Hu |
| 9,031,296 B2 | 5/2015 | Kaempfer |
| 9,043,545 B2 | 5/2015 | Kimmel |
| 9,088,300 B1 | 7/2015 | Chen |
| 9,092,223 B1 | 7/2015 | Pani |
| 9,129,628 B1 | 9/2015 | Fallone |
| 9,141,176 B1 | 9/2015 | Chen |
| 9,208,817 B1 | 12/2015 | Li |
| 9,213,627 B2 | 12/2015 | Van Acht |
| 9,258,014 B2 * | 2/2016 | Anderson ............. H03M 13/11 |
| 9,280,472 B1 | 3/2016 | Dang |
| 9,280,487 B2 | 3/2016 | Candelaria |
| 9,311,939 B1 | 4/2016 | Malina |
| 9,336,340 B1 | 5/2016 | Dong |
| 9,436,595 B1 | 9/2016 | Benitez |
| 9,495,263 B2 | 11/2016 | Pang |
| 9,529,601 B1 | 12/2016 | Dharmadhikari |
| 9,529,670 B2 | 12/2016 | O'Connor |
| 9,575,982 B1 | 2/2017 | Sankara Subramanian |
| 9,588,698 B1 | 3/2017 | Karamcheti |
| 9,588,977 B1 | 3/2017 | Wang |
| 9,607,631 B2 | 3/2017 | Rausch |
| 9,671,971 B2 | 6/2017 | Trika |
| 9,722,632 B2 * | 8/2017 | Anderson ......... H03M 13/1575 |
| 9,747,202 B1 | 8/2017 | Shaharabany |
| 9,830,084 B2 * | 11/2017 | Thakkar .............. G06F 12/0238 |
| 9,852,076 B1 | 12/2017 | Garg |
| 9,875,053 B2 | 1/2018 | Frid |
| 9,912,530 B2 | 3/2018 | Singatwaria |
| 9,933,973 B2 * | 4/2018 | Luby .................. G06F 11/1088 |
| 9,946,596 B2 | 4/2018 | Hashimoto |
| 10,013,169 B2 | 7/2018 | Fisher |
| 10,199,066 B1 | 2/2019 | Feldman |
| 10,229,735 B1 | 3/2019 | Natarajan |
| 10,235,198 B2 | 3/2019 | Qiu |
| 10,268,390 B2 | 4/2019 | Warfield |
| 10,318,467 B2 | 6/2019 | Barzik |
| 10,361,722 B2 | 7/2019 | Lee |
| 10,417,086 B2 * | 9/2019 | Lin ..................... G06F 11/1044 |
| 10,437,670 B1 | 10/2019 | Koltsidas |
| 10,459,663 B2 | 10/2019 | Agombar |
| 10,459,794 B2 * | 10/2019 | Baek .................. G06F 11/1048 |
| 10,484,019 B2 * | 11/2019 | Weinberg .......... H03M 13/2906 |
| 10,530,391 B2 * | 1/2020 | Galbraith ............ G06F 11/1072 |
| 10,635,529 B2 * | 4/2020 | Bolkhovitin ........ G06F 11/1068 |
| 10,642,522 B2 | 5/2020 | Li |
| 10,649,657 B2 | 5/2020 | Zaidman |
| 10,678,432 B1 | 6/2020 | Dreier |
| 10,756,816 B1 | 8/2020 | Dreier |
| 10,928,847 B2 | 2/2021 | Suresh |
| 2001/0032324 A1 | 10/2001 | Slaughter |
| 2002/0010783 A1 | 1/2002 | Primak |
| 2002/0039260 A1 | 4/2002 | Kilmer |
| 2002/0073358 A1 | 6/2002 | Atkinson |
| 2002/0095403 A1 | 7/2002 | Chandrasekaran |
| 2002/0112085 A1 | 8/2002 | Berg |
| 2002/0161890 A1 | 10/2002 | Chen |
| 2003/0074319 A1 | 4/2003 | Jaquette |
| 2003/0145274 A1 | 7/2003 | Hwang |
| 2003/0163594 A1 | 8/2003 | Aasheim |
| 2003/0163633 A1 | 8/2003 | Aasheim |
| 2003/0217080 A1 | 11/2003 | White |
| 2004/0010545 A1 | 1/2004 | Pandya |
| 2004/0066741 A1 | 4/2004 | Dinker |
| 2004/0103238 A1 | 5/2004 | Avraham |
| 2004/0143718 A1 | 7/2004 | Chen |
| 2004/0255171 A1 | 12/2004 | Zimmer |
| 2004/0267752 A1 | 12/2004 | Wong |
| 2004/0268278 A1 | 12/2004 | Hoberman |
| 2005/0038954 A1 | 2/2005 | Saliba |
| 2005/0097126 A1 | 5/2005 | Cabrera |
| 2005/0138325 A1 | 6/2005 | Hofstee |
| 2005/0144358 A1 | 6/2005 | Conley |
| 2005/0149827 A1 | 7/2005 | Lambert |
| 2005/0174670 A1 | 8/2005 | Dunn |
| 2005/0177672 A1 | 8/2005 | Rao |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0031709 A1 | 2/2006 | Hiraiwa |
| 2006/0101197 A1 | 5/2006 | Georgis |
| 2006/0156012 A1 | 7/2006 | Beeson |
| 2006/0184813 A1 | 8/2006 | Bui |
| 2007/0033323 A1 | 2/2007 | Gorobets |
| 2007/0061502 A1 | 3/2007 | Lasser |
| 2007/0101096 A1 | 5/2007 | Gorobets |
| 2007/0250756 A1 | 10/2007 | Gower |
| 2007/0266011 A1 | 11/2007 | Rohrs |
| 2007/0283081 A1 | 12/2007 | Lasser |
| 2007/0283104 A1 | 12/2007 | Wellwood |
| 2007/0285980 A1 | 12/2007 | Shimizu |
| 2008/0034154 A1 | 2/2008 | Lee |
| 2008/0065805 A1 | 3/2008 | Wu |
| 2008/0082731 A1 | 4/2008 | Karamcheti |
| 2008/0112238 A1 | 5/2008 | Kim |
| 2008/0163033 A1 | 7/2008 | Yim |
| 2008/0301532 A1 | 12/2008 | Uchikawa |
| 2009/0006667 A1 | 1/2009 | Lin |
| 2009/0089544 A1 | 4/2009 | Liu |
| 2009/0113219 A1 | 4/2009 | Aharonov |
| 2009/0125788 A1 | 5/2009 | Wheeler |
| 2009/0183052 A1 | 7/2009 | Kanno |
| 2009/0254705 A1 | 10/2009 | Abali |
| 2009/0282275 A1 | 11/2009 | Yermalayeu |
| 2009/0287956 A1 | 11/2009 | Flynn |
| 2009/0307249 A1 | 12/2009 | Koifman |
| 2009/0307426 A1 | 12/2009 | Galloway |
| 2009/0310412 A1 | 12/2009 | Jang |
| 2010/0031000 A1 | 2/2010 | Flynn |
| 2010/0169470 A1 | 7/2010 | Takashige |
| 2010/0217952 A1 | 8/2010 | Iyer |
| 2010/0229224 A1 | 9/2010 | Etchegoyen |
| 2010/0241848 A1 | 9/2010 | Smith |
| 2010/0321999 A1 | 12/2010 | Yoo |
| 2010/0325367 A1 | 12/2010 | Kornegay |
| 2010/0332922 A1 | 12/2010 | Chang |
| 2011/0031546 A1 | 2/2011 | Uenaka |
| 2011/0055458 A1 | 3/2011 | Kuehne |
| 2011/0055471 A1 | 3/2011 | Thatcher |
| 2011/0060722 A1 | 3/2011 | Li |

(56) References Cited

U.S. PATENT DOCUMENTS

| | | |
|---|---|---|
| 2011/0072204 A1 | 3/2011 | Chang |
| 2011/0099418 A1 | 4/2011 | Chen |
| 2011/0153903 A1 | 6/2011 | Hinkle |
| 2011/0161784 A1 | 6/2011 | Selinger |
| 2011/0191525 A1 | 8/2011 | Hsu |
| 2011/0218969 A1 | 9/2011 | Anglin |
| 2011/0231598 A1 | 9/2011 | Hatsuda |
| 2011/0239083 A1 | 9/2011 | Kanno |
| 2011/0252188 A1 | 10/2011 | Weingarten |
| 2011/0258514 A1 | 10/2011 | Lasser |
| 2011/0289263 A1 | 11/2011 | McWilliams |
| 2011/0289280 A1 | 11/2011 | Koseki |
| 2011/0292538 A1 | 12/2011 | Haga |
| 2011/0296411 A1 | 12/2011 | Tang |
| 2011/0299317 A1 | 12/2011 | Shaeffer |
| 2011/0302353 A1 | 12/2011 | Confalonieri |
| 2012/0017037 A1 | 1/2012 | Riddle |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0151253 A1 | 6/2012 | Horn |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2012/0324312 A1 | 12/2012 | Moyer |
| 2012/0331207 A1 | 12/2012 | Lassa |
| 2013/0013880 A1 | 1/2013 | Tashiro |
| 2013/0016970 A1 | 1/2013 | Koka |
| 2013/0018852 A1 | 1/2013 | Barton |
| 2013/0024605 A1 | 1/2013 | Sharon |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0191601 A1 | 7/2013 | Peterson |
| 2013/0205183 A1 | 8/2013 | Fillingim |
| 2013/0219131 A1 | 8/2013 | Alexandron |
| 2013/0227347 A1 | 8/2013 | Cho |
| 2013/0238955 A1 | 9/2013 | Antonio |
| 2013/0254622 A1 | 9/2013 | Kanno |
| 2013/0318283 A1 | 11/2013 | Small |
| 2013/0318395 A1 | 11/2013 | Kalavade |
| 2013/0329492 A1 | 12/2013 | Yang |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0082412 A1 | 3/2014 | Matsumura |
| 2014/0095769 A1 | 4/2014 | Borkenhagen |
| 2014/0095827 A1 | 4/2014 | Wei |
| 2014/0108414 A1 | 4/2014 | Stillerman |
| 2014/0108891 A1 | 4/2014 | Strasser |
| 2014/0164447 A1 | 6/2014 | Tarafdar |
| 2014/0164879 A1 | 6/2014 | Tam |
| 2014/0181532 A1 | 6/2014 | Camp |
| 2014/0195564 A1 | 7/2014 | Talagala |
| 2014/0215129 A1 | 7/2014 | Kuzmin |
| 2014/0223079 A1 | 8/2014 | Zhang |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0143030 A1 | 5/2015 | Gorobets |
| 2015/0199234 A1 | 7/2015 | Choi |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0286477 A1 | 10/2015 | Mathur |
| 2015/0294684 A1 | 10/2015 | Qjang |
| 2015/0301964 A1 | 10/2015 | Brinicombe |
| 2015/0304108 A1 | 10/2015 | Obukhov |
| 2015/0310916 A1 | 10/2015 | Leem |
| 2015/0317095 A1 | 11/2015 | Voigt |
| 2015/0341123 A1 | 11/2015 | Nagarajan |
| 2015/0347025 A1 | 12/2015 | Law |
| 2015/0363271 A1 | 12/2015 | Haustein |
| 2015/0363328 A1 | 12/2015 | Candelaria |
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048327 A1 | 2/2016 | Jayasena |
| 2016/0048341 A1 | 2/2016 | Constantinescu |
| 2016/0054922 A1 | 2/2016 | Awasthi |
| 2016/0062885 A1 | 3/2016 | Ryu |
| 2016/0077749 A1 | 3/2016 | Ravimohan |
| 2016/0077764 A1 | 3/2016 | Ori |
| 2016/0077968 A1 | 3/2016 | Sela |
| 2016/0098344 A1 | 4/2016 | Gorobets |
| 2016/0098350 A1 | 4/2016 | Tang |
| 2016/0103631 A1 | 4/2016 | Ke |
| 2016/0110254 A1 | 4/2016 | Cronie |
| 2016/0132237 A1 | 5/2016 | Jeong |
| 2016/0154601 A1 | 6/2016 | Chen |
| 2016/0155750 A1 | 6/2016 | Yasuda |
| 2016/0162187 A1 | 6/2016 | Lee |
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0203000 A1 | 7/2016 | Parmar |
| 2016/0224267 A1 | 8/2016 | Yang |
| 2016/0232103 A1 | 8/2016 | Schmisseur |
| 2016/0234297 A1 | 8/2016 | Ambach |
| 2016/0239074 A1 | 8/2016 | Lee |
| 2016/0239380 A1 | 8/2016 | Wideman |
| 2016/0274636 A1 | 9/2016 | Kim |
| 2016/0306699 A1 | 10/2016 | Resch |
| 2016/0306853 A1 | 10/2016 | Sabaa |
| 2016/0321002 A1 | 11/2016 | Jung |
| 2016/0335085 A1 | 11/2016 | Scalabrino |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2016/0381442 A1 | 12/2016 | Heanue |
| 2017/0004037 A1 | 1/2017 | Park |
| 2017/0010652 A1 | 1/2017 | Huang |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0123655 A1 | 5/2017 | Sinclair |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |

(56) References Cited

U.S. PATENT DOCUMENTS

| | | |
|---|---|---|
| 2017/0177217 A1 | 6/2017 | Kanno |
| 2017/0177259 A1* | 6/2017 | Motwani ............ G06F 11/1012 |
| 2017/0185498 A1 | 6/2017 | Gao |
| 2017/0192848 A1 | 7/2017 | Pamies-Juarez |
| 2017/0199823 A1 | 7/2017 | Hayes |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |
| 2017/0242722 A1 | 8/2017 | Qiu |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0262217 A1 | 9/2017 | Pradhan |
| 2017/0269998 A1 | 9/2017 | Jung |
| 2017/0279460 A1 | 9/2017 | Camp |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1 | 3/2018 | Oh |
| 2018/0069658 A1 | 3/2018 | Benisty |
| 2018/0074730 A1 | 3/2018 | Inoue |
| 2018/0076828 A1 | 3/2018 | Kanno |
| 2018/0088867 A1 | 3/2018 | Kaminaga |
| 2018/0107591 A1 | 4/2018 | Smith |
| 2018/0113631 A1 | 4/2018 | Zhang |
| 2018/0143780 A1 | 5/2018 | Cho |
| 2018/0150640 A1 | 5/2018 | Li |
| 2018/0165038 A1 | 6/2018 | Authement |
| 2018/0165169 A1 | 6/2018 | Camp |
| 2018/0165340 A1 | 6/2018 | Agarwal |
| 2018/0167268 A1 | 6/2018 | Liguori |
| 2018/0173620 A1 | 6/2018 | Cen |
| 2018/0188970 A1 | 7/2018 | Liu |
| 2018/0189175 A1 | 7/2018 | Ji |
| 2018/0189182 A1 | 7/2018 | Wang |
| 2018/0212951 A1 | 7/2018 | Goodrum |
| 2018/0219561 A1 | 8/2018 | Litsyn |
| 2018/0226124 A1 | 8/2018 | Perner |
| 2018/0232151 A1 | 8/2018 | Badam |
| 2018/0260148 A1 | 9/2018 | Klein |
| 2018/0270110 A1 | 9/2018 | Chugtu |
| 2018/0293014 A1 | 10/2018 | Ravimohan |
| 2018/0300203 A1 | 10/2018 | Kathpal |
| 2018/0321864 A1 | 11/2018 | Benisty |
| 2018/0322024 A1 | 11/2018 | Nagao |
| 2018/0329776 A1 | 11/2018 | Lai |
| 2018/0336921 A1 | 11/2018 | Ryun |
| 2018/0349396 A1 | 12/2018 | Blagojevic |
| 2018/0356992 A1 | 12/2018 | Lamberts |
| 2018/0357126 A1 | 12/2018 | Dhuse |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0050327 A1 | 2/2019 | Li |
| 2019/0065085 A1 | 2/2019 | Jean |
| 2019/0073261 A1 | 3/2019 | Halbert |
| 2019/0073262 A1 | 3/2019 | Chen |
| 2019/0087089 A1 | 3/2019 | Yoshida |
| 2019/0087115 A1 | 3/2019 | Li |
| 2019/0087328 A1 | 3/2019 | Kanno |
| 2019/0116127 A1 | 4/2019 | Pismenny |
| 2019/0171532 A1 | 6/2019 | Abadi |
| 2019/0172820 A1 | 6/2019 | Meyers |
| 2019/0196748 A1 | 6/2019 | Badam |
| 2019/0196907 A1 | 6/2019 | Khan |
| 2019/0205206 A1 | 7/2019 | Hornung |
| 2019/0212949 A1 | 7/2019 | Pletka |
| 2019/0220392 A1 | 7/2019 | Lin |
| 2019/0227927 A1 | 7/2019 | Miao |
| 2019/0272242 A1 | 9/2019 | Kachare |
| 2019/0278654 A1 | 9/2019 | Kaynak |
| 2019/0317901 A1 | 10/2019 | Kachare |
| 2019/0339998 A1 | 11/2019 | Momchilov |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0013458 A1 | 1/2020 | Schreck |
| 2020/0042223 A1 | 2/2020 | Li |
| 2020/0042387 A1 | 2/2020 | Shani |
| 2020/0089430 A1 | 3/2020 | Kanno |
| 2020/0097189 A1 | 3/2020 | Tao |
| 2020/0143885 A1 | 5/2020 | Kim |
| 2020/0159425 A1 | 5/2020 | Flynn |
| 2020/0167091 A1 | 5/2020 | Haridas |
| 2020/0225875 A1 | 7/2020 | Oh |
| 2020/0242021 A1 | 7/2020 | Gholamipour |
| 2020/0250032 A1 | 8/2020 | Goyal |
| 2020/0257598 A1 | 8/2020 | Yazovitsky |
| 2020/0326855 A1 | 10/2020 | Wu |
| 2020/0328192 A1 | 10/2020 | Zaman |
| 2020/0348888 A1 | 11/2020 | Kim |
| 2020/0387327 A1 | 12/2020 | Hsieh |
| 2020/0401334 A1 | 12/2020 | Saxena |
| 2020/0409791 A1 | 12/2020 | Devriendt |
| 2021/0010338 A1 | 1/2021 | Santos |
| 2021/0089392 A1 | 3/2021 | Shirakawa |
| 2021/0103388 A1 | 4/2021 | Choi |

FOREIGN PATENT DOCUMENTS

| | | |
|---|---|---|
| WO | 9418634 | 8/1994 |
| WO | 1994018634 | 8/1994 |

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India, pp. 1-7, 2017, <10.1145/3124680.3124741 >. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14https://www.syncids.com/#.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime, "Design, Automation & Text in Europe Conference & Exhibition (DATE), 2013.

Yang, T. Wu, H. and W. Sun, "GD-FTL: Improving the Performance and Lifetime of TLC SSD by Downgrading Worn-out Blocks,"

(56) References Cited

OTHER PUBLICATIONS

IEEE 37th International Performance Computing and Communications Conference (IPCCC), 2018.
C. Wu, D. Wu, H. Chou and C. Cheng, "Rethink the Design of Flash Translation Layers in a Component-Based View", in IEEE Acess, vol. 5, pp. 12895-12912, 2017.
Po-Liang Wu, Yuan-Hao Chang and T. Kuo, "A file-system-aware FTL design for flash-memory storage systems," 2009, pp. 393-398.
S. Choudhuri and T. Givargis, "Preformance improvement of block based NAND flash translation layer", 2007 5th IEEE/ACM/IFIP International Conference on Hardware/Software Codesign and Systems Synthesis (CODES+ISSS). Saizburg, 2007, pp. 257-262.
A. Zuck, O. Kishon and S. Toledo. "LSDM: Improving the Preformance of Mobile Storage with a Log-Structured Address Remapping Device Driver", 2014 Eighth International Conference on Next Generation Mobile Apps, Services and Technologies, Oxford, 2014, pp. 221-228.
J. Jung and Y. Won, "nvramdisk: A Transactional Block Device Driver for Non-Volatile RAM", in IEEE Transactions on Computers, vol. 65, No. 2, pp. 589-600, Feb. 1, 2016.
Te I et al. (Pensieve: a Machine Assisted SSD Layer for Extending the Lifetime: (Year: 2018).
ARM ("Cortex-R5 and Cortex-R5F", Technical reference Manual, Revision r1p1) (Year:2011).

\* cited by examiner

METHOD AND SYSTEM FOR FACILITATING A STORAGE SERVER WITH HYBRID MEMORY FOR JOURNALING AND DATA STORAGE

BACKGROUND

Field

This disclosure is generally related to the field of data storage. More specifically, this disclosure is related to a method and system for facilitating a storage server with hybrid memory for journaling and data storage.

Related Art

Today, various storage systems are being used to store and access the ever-increasing amount of digital content. A storage system can include storage servers with one or more storage devices or drives (such as a solid-state drive (SSD)). Data can be stored in a non-volatile storage media of an SSD, e.g., in Not-And flash (NAND) flash. As storage systems continue to develop with increased capacity and bandwidth requirements, storage systems may require network updates along with other enhancements in architecture and design in order to maintain or increase the performance and efficiency of such storage systems. Two enhancements can include journaling and compression.

In a journal drive or region, data can be updated with sufficient throughput to meet high-speed Ethernet (e.g., 200 Gigabyte (Gb) and beyond) and can result in a reduction in access latency. Compression in a storage server or system can be developed to reduce both the amount of data transferred through various fabrics and the utilization of storage capacity. One current solution involves using a fast storage medium as the "journal drive" for sufficient output and endurance, and using a Non-Volatile Memory Express (NVMe) SSD as the "data drive," as described below in relation to FIG. 1. In this solution, a server can allocate space in a dual in-line memory module (DIMM) as a data buffer, in which data is received via a network interface card (NIC) and is temporarily held for conversion to the appropriate format for the journal drive and the data drive. The data can be sent back to the NIC for compression, and subsequently erasure code (EC)-encoded. The EC-encoded data can be sent both to the data buffers of other servers in a same storage cluster and to the data drives. However, the data paths involved in these communications can be long, and can result in a bottleneck which affects the bandwidth of both a Peripheral Component Interconnect Express (PCIe) bus and the memory bus.

Thus, while journaling and compression can result in improvements in developing storage systems, the challenge remains to provide consistent optimization in compatibility, efficiency, and collaboration.

SUMMARY

One embodiment provides a system which facilitates data management. During operation, the system receives, by a first memory device, data to be written to a first non-volatile memory of the first memory device and to a second non-volatile memory of a storage drive distinct from the first memory device. The system performs, by the first memory device on the received data, a compression operation and erasure code (EC)-encoding to obtain a compressed EC codeword. The system initiates a first write operation and a second write operation in parallel, wherein the first write operation comprises writing a first part of the compressed EC codeword to the first non-volatile memory, and wherein the second write operation comprises writing the first part of the compressed EC codeword to the second non-volatile memory.

In some embodiments, the system receives, from a second memory device, at least one part of other compressed EC codewords. The system performs error correction code (ECC)-encoding on the received at least one part to obtain at least one ECC-encoded part. The system initiates a third write operation and a fourth write operation in parallel, wherein the third write operation comprises writing the at least one ECC-encoded part to the first non-volatile memory, and wherein the fourth write operation comprises writing the at least one ECC-encoded part to the second non-volatile memory.

In some embodiments, the first memory device and the second memory device operate in a distributed storage system.

In some embodiments, the system transmits a remainder of the compressed EC codeword to a second memory device, wherein the remainder comprises all parts except the first part of the compressed EC codeword, wherein the remainder is received by a controller of the second memory device, and wherein the controller of the second memory device performs error correction code (ECC)-encoding on the received remainder of the compressed EC codeword.

In some embodiments, responsive to completing the first write operation, the system generates an acknowledgment of the completion destined for a requesting host.

In some embodiments, the compression operation and EC-encoding are performed by a controller of the first memory device.

In some embodiments, writing the first part of the compressed EC codeword to the first non-volatile memory comprises accessing, by the controller, the first non-volatile memory of the first memory device via a first interface which manages communication with the first non-volatile memory via multiple channels. A respective channel of the multiple channels includes a NAND switch which allows the respective channel to serve as a plurality of channels by which to access the first non-volatile memory.

In some embodiments, the controller comprises: the first interface; a second interface which manages communication with a host; a volatile memory controller; a plurality of parallel compression engines; an erasure code (EC) encoder module; and a plurality of error correction code (ECC) encoder modules.

In some embodiments, the system receives a request to read second data stored in the first non-volatile memory, wherein the second data comprises the first part of the compressed EC codeword. The system retrieves the stored second data from the first non-volatile memory. The system performs, by an ECC decoder module of the controller, ECC-decoding on the retrieved second data to obtain ECC-decoded data. Responsive to determining that a recovery operation involving erasure code decoding is to be performed on the ECC-decoded data, the system performs, by an EC decoder module of the controller, EC-decoding on the ECC-decoded data. The system performs, by a decompression module of the controller, decompression on the ECC-decoded data to obtain decompressed data. The system returns, to a requesting host or application, the decompressed data.

In some embodiments, the first non-volatile memory comprises single-level cell (SLC) Not-And (NAND) flash memory.

In some embodiments, the system initiates the first and second write operations by performing error correction code (ECC)-encoding on the first part of the compressed EC codeword to obtain an ECC-encoded first part. Writing the first part of the compressed EC codeword to the first non-volatile memory comprises writing the ECC-encoded first part to the first non-volatile memory. The first part of the compressed EC codeword is written to the second non-volatile memory of the storage via a Peripheral Component Interconnect Express (PCIe) bus.

BRIEF DESCRIPTION OF THE FIGURES

In the figures, like reference numerals refer to the same figure elements.

DETAILED DESCRIPTION

Figure 1:
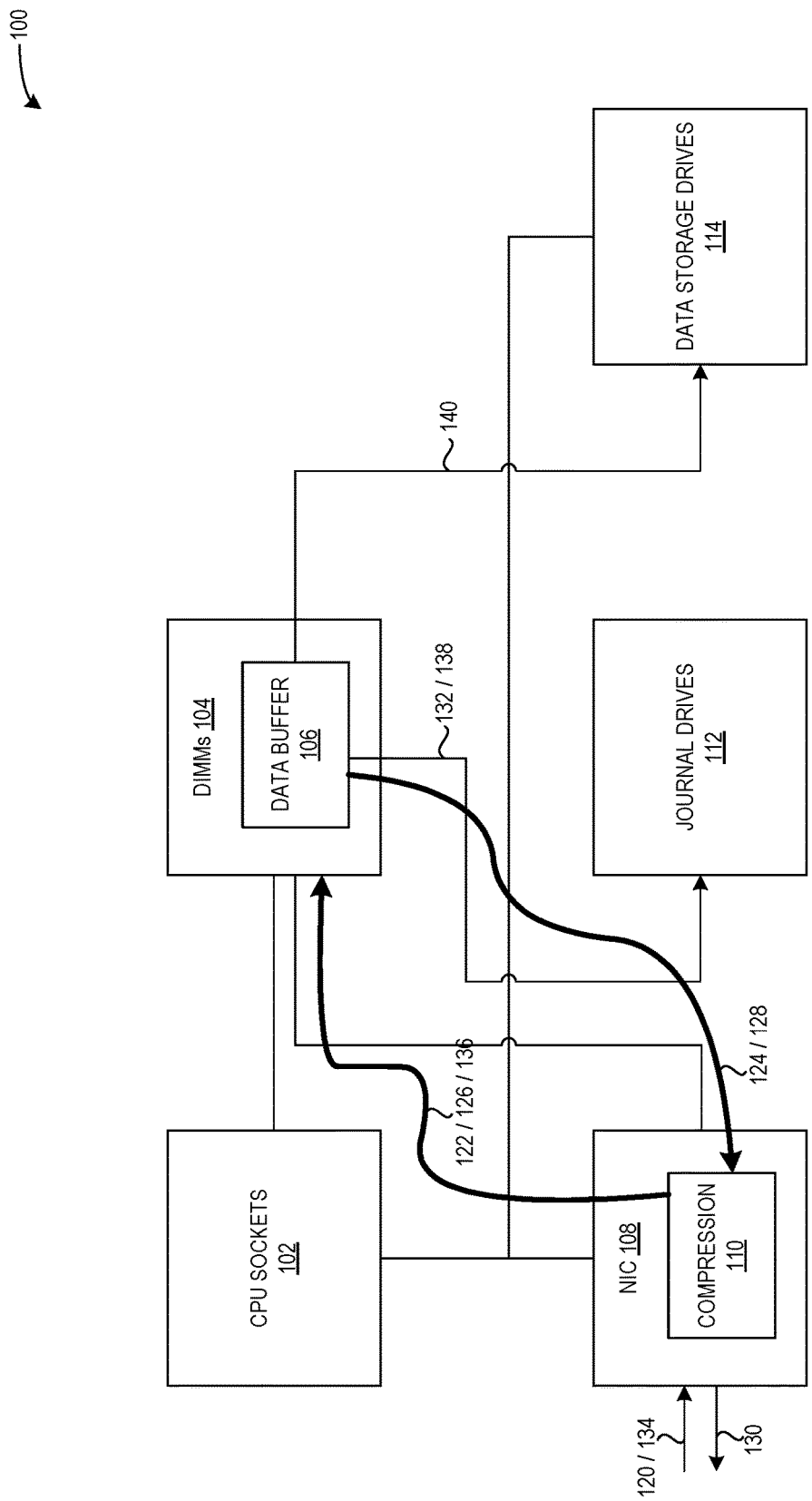
FIG. 1 illustrates an exemplary environment for facilitating journaling and data storage in a storage cluster, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein provide a system which facilitates efficient data compression based on error correction code (ECC)-encoding and reorganization of data placement.

As storage systems continue to develop with increased capacity and bandwidth requirements, storage systems may require network updates along with other enhancements in architecture and design in order to maintain or increase the performance and efficiency of such storage systems. Two enhancements can include journaling and compression.

In a journal drive or region, data can be updated with sufficient throughput to meet high-speed Ethernet (e.g., 200 Gb and beyond) and can result in a reduction in access latency. Compression in a storage server or system can be developed to reduce both the amount of data transferred through various fabrics and the utilization of storage capacity. One current solution involves using a fast storage medium as the "journal drive" for sufficient output and endurance, and using an NVMe SSD as the "data drive," as described below in relation to FIG. 1. In this solution, a server can allocate space in the DIMM as a data buffer, in which data is received via a network interface card (NIC) and is temporarily held for conversion to the appropriate format for the journal drive and the data drive. The data can be sent back to the NIC for compression, and subsequently erasure code (EC)-encoded. The EC-encoded data can be sent both to the data buffers of other servers in a same storage cluster and to the data drives. However, the data paths involved in these communications can be long, and can result in a bottleneck which affects the bandwidth of both the PCIe bus and the memory bus.

Thus, while journaling and compression can result in improvements in developing storage systems, the challenge remains to provide consistent optimization in compatibility, efficiency, and collaboration.

The embodiments described herein provide a system which addresses this challenge by providing a memory device (e.g., a "hybrid memory device" or a "hybrid DIMM") which integrates a journal drive, a data buffer, compression, and erasure code (EC)-encoding/decoding. Given a plurality of servers in a storage cluster, a server can receive data via a NIC and transfer the data to a data buffer in the hybrid DIMM, where the data is organized into the appropriate format for the journal drive and the storage drive. A controller in the hybrid DIMM can perform compression and EC-encoding to obtain a compressed EC codeword. The hybrid DIMM can retain a part of the compressed EC codeword (the "local part") and also distribute the remainder of the compressed EC codeword to other servers in the storage cluster. The controller can also receive parts of other compressed EC codewords from the other servers in the storage cluster. The controller can write the local part, and the received parts of the other compressed EC codewords, to the integrated journal drive. The integrated journal drive can be implemented as SLC NAND flash memory and accessed via multiple channels via the backend of the controller. The controller can also write the local part, and the received parts of the other compressed EC codewords, to the storage drive, e.g., via a PCIe bus. An exemplary hybrid DIMM is described below in relation to FIG. 3, and an exemplary hybrid DIMM controller is described below in relation to FIG. 4.

The system can acknowledge the write as complete as soon as the local part and the received parts are moved to a write buffer of the integrated journal drive. Thus, by not waiting for a completion of the write operation to the storage drive (which transfer occurs over the PCIe bus), the system can provide a reduced write latency, which can result in an improved efficiency for the server and the overall storage cluster. An exemplary environment for facilitating journaling and data storage, including communications between these components, is described below in relation to FIG. 2.

Thus, the described embodiments provide a system which can use a hybrid DIMM (memory device) which adopts a transparent collaboration with CPUs using known protocols, and can also utilize a hybrid DIMM controller with enhanced throughput to match the high-speed network by: reducing the amount of data moved back and forth between memory components; increasing the parallelism of the write path; and accelerating the access to the NAND itself (i.e., reducing the access latency).

The described embodiments thus solve the technological problem of improving the efficiency and performance of a storage system by providing a technological solution based on the hybrid memory device, the hybrid memory device controller, the compression and EC-encoding functionality in the hybrid memory device controller, and the communications between the various memory components.

A "distributed storage system," a "storage system," or a "storage cluster" can include multiple storage servers. A "storage server" or a "storage system" can refer to a computing device which can include multiple storage devices or storage drives. A "storage device" or a "storage drive" refers to a device or a drive with a non-volatile memory which can provide persistent storage of data, e.g., a solid-state drive (SSD), or a flash-based storage device. A storage system can also be a computer system.

"Non-volatile memory" refers to storage media which may be used for persistent storage of data, e.g., flash memory of a NAND die of an SSD, magnetoresistive random access memory (MRAM), phase change memory (PCM), resistive random access memory (ReRAM), or another non-volatile memory.

A "memory device" refers to a device which may be used for both persistent and non-persistent storage of data. In this disclosure, an example of a memory device is referred to as a "hybrid memory device" or a "hybrid DIMM," which can include: a DDR interface; a volatile memory; a controller; a compression/decompression module; a non-volatile memory (e.g., SLC NAND) which serves as a journal region or drive, or for storage of journal data; and multiple channels via which to access the non-volatile memory of the hybrid memory device. An exemplary hybrid memory device or hybrid DIMM is described below in relation to FIG. 3. The controller of the memory device can be referred to as a "hybrid memory device controller" or a "hybrid DIMM controller." An exemplary hybrid DIMM controller is described below in relation to FIG. 4.

"Volatile memory" refers to media which may be used to store data temporarily and in which power is required to maintain the stored data. Examples of volatile memory include DDR DRAM.

A "computing device" refers to any server, device, node, entity, drive, or any other entity which can provide any computing capabilities.

Exemplary Environment for Journaling and Data Storage in the Prior Art

FIG. 1 illustrates an exemplary environment 100 for facilitating journaling and data storage in a storage cluster, in accordance with the prior art. Environment 100 can include: central processing unit (CPU) sockets 102; DIMMs 104 which can include a data buffer 106; a NIC 108 which can include a compression module 110; journal drives 112; and data storage drives 114. Data buffer 106 can include a certain amount of space in DIMMs 104 which is allocated for storage of data associated with processing data (e.g., compressing/decompressing, EC-encoding/decoding, and ECC-encoding/decoding). Journal drives 112 can include, e.g., a fast storage medium with sufficient throughput and endurance, (e.g., optane SSD), while data storage drives 114 can include, e.g., Non-Volatile Memory Express (NVMe) SSDs.

During operation, NIC 108 can receive data from a client, such as a host or application (via a communication 120). The system can hold the data temporarily in data buffer 106 (e.g., sent to data buffer 106 via a communication 122), where the data can be converted to the appropriate format for journal drives 112 ("original journal data") and data storage drives 114 ("data"). For the original journal data, the system can send the original journal data back to NIC 108 for compression (via a communication 124) and subsequent erasure code (EC)-encoding (e.g., sent to data buffer 106 via a communication 126). The system can send the EC-encoded data to the data buffers of other servers in a same storage cluster (via communications 128 and 130) and to journal drives 112 (via a communication 132). In addition, the system depicted in environment 100 can receive part of a compressed and EC-protected codeword which is to be stored in journal drive 112 (e.g., journal data from the other servers) (via a communication 134). The system can write this received journal data to data buffer 106 (via a communication 136) and to journal drives 112 (via a communication 138).

For the data, the system can process the data in parallel, which can include: moving the data from data buffer 106 to NIC 108 for compression (similar to communication 124); moving the compressed data from NIC 108 to data buffer 106 for EC-encoding (similar to communication 126); moving the compressed EC-encoded data from data buffer 106 to the data buffers of other storage servers (similar to communications 128 and 130); and moving the compressed EC-encoded data from data buffer 106 to data storage drives 114 (via a communication 140).

Thus, environment 100 depicts a system or server which includes many communications between the NIC, the DIMMs, the journal drives, and the data storage drives (involving a memory bus), as well as communications to other servers in a same storage cluster or distributed storage system (involving, e.g., a PCIe bus). These communications can result in long data paths, which can result in a bottleneck which affects the bandwidth of both the PCIe bus and the memory bus. Latency over the PCIe bus can also introduce latency issues. Moreover, in order to match the high-throughput Ethernet, the selection of the journal drives may be limited to high-end devices with a significant or non-trivial cost.

Exemplary Environment for Journaling and Data Storage Using a Hybrid Memory Device In general, journal drives may be sequentially written to with high throughput and high endurance, but only read from in order to perform data recovery in abnormal conditions (i.e., not frequently). Furthermore, the limited number of PCIe lanes supported by CPUs may result in a challenge for journal writing. At the same time, data compression and EC-encoding may be most efficiently performed in close physical proximity to the data buffer. When these operations are not performed close to the data buffer, the bi-directional transfer can consume a considerable amount of both PCIe bandwidth and the memory bus bandwidth, as described above in relation to FIG. 1.

The embodiments described herein address the challenges associated with prior art environment 100 of FIG. 1 by providing a system which provides an in-situ analysis of the data for placement. The described embodiments provide a hybrid memory device (such as a hybrid DIMM) which can integrate the journal drive, the data buffer, the compression operation, and EC-encoding/decoding. The hybrid DIMM can include a double data rate (DDR) interface such that the communication between the CPU and the hybrid DIMM remains the same as in the conventional system. The hybrid DIMM can integrate the journal drive in a block device format in parallel with the DIMM space, as described below in relation to FIG. 2.

Figure 2:
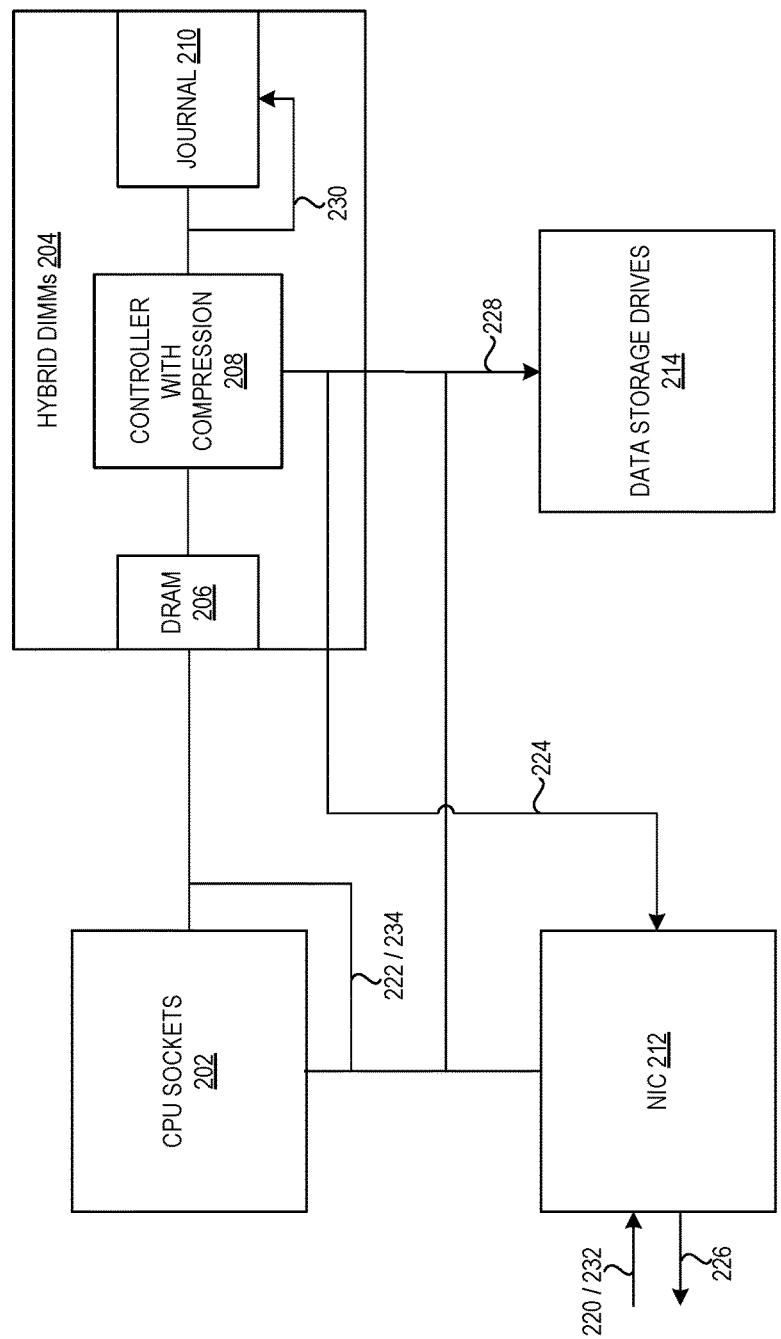
FIG. 2 illustrates an exemplary environment for facilitating journaling and data storage in a storage cluster, in accordance with an embodiment of the present application.

FIG. 2 illustrates an exemplary environment 200 for facilitating journaling and data storage in a storage cluster, in accordance with an embodiment of the present application. Environment 220 can include: CPU sockets 202; hybrid DIMMs 204; a NIC 212; and data storage drives 214. Hybrid DIMMs 204 can include: dynamic random access memory (DRAM) 206; a controller with compression 208, where the compression can be a module which is a hardware-implemented function; and journal storage 210.

During operation, NIC 212 can receive data from a client, such as a host or application (via a communication 220). The system can transfer the received original client data from NIC 212 to DRAM 206 (via a communication 222), where the data can be converted to the appropriate format for the journal drives ("original journal data") and the data storage drives ("data"). Controller 208 can perform (finish) compression and EC-encoding of the data to obtain a compressed EC codeword. Controller 208 can retain a first part of the compressed EC codeword (the "local part"), and distribute or send the remainder of the compressed EC codeword to other servers in the cluster via NIC 212 (via communications 224 and 226). The system depicted in environment 200 can also receive at least one part of other compressed EC codewords from other servers, where the at least one part is to be stored in journal storage 210 (e.g., journal data from the other servers) (via a communication 232). The system can transfer the at least one part of the other compressed EC codewords to DRAM 206 (via a communication 234). The system can flush or write both the first part of the compressed EC codeword (e.g., the local part) and the received at least one part of the other compressed EC codewords from controller 208 to journal 210 (via a communication 230). The system can write data via communication 230 to journal storage 210 via multiple channels, as described below in relation to FIG. 4.

The system can also write both the first part of the compressed EC codeword (e.g., the local part) and the received at least one part of the other compressed EC codewords from controller 208 to data storage drives 214 (via a communication 228), e.g., via a PCIe bus.

Thus, environment 200 depicts how the communications with and within hybrid DIMMs 204 can result in a reduction in the consumption of bandwidth for handling journal data and in the compression, as both the compression and EC-encoding operations occur close to journal storage 210 (e.g., in controller with compression 208). Furthermore, the described system can result in a reduction in latency of write operations. As long as the data is moved into the write buffer of journal storage 210, the write operations (which include both the journal data and the data) may be considered as complete. This can result in the reduction of the latency involved in operations over the PCIe bus. Therefore, by shortening the write path for the journal data, the described embodiments can achieve an improvement in the performance of each individual server as well as the overall storage cluster or distributed storage system.

Exemplary Hybrid Memory Device

Figure 3:
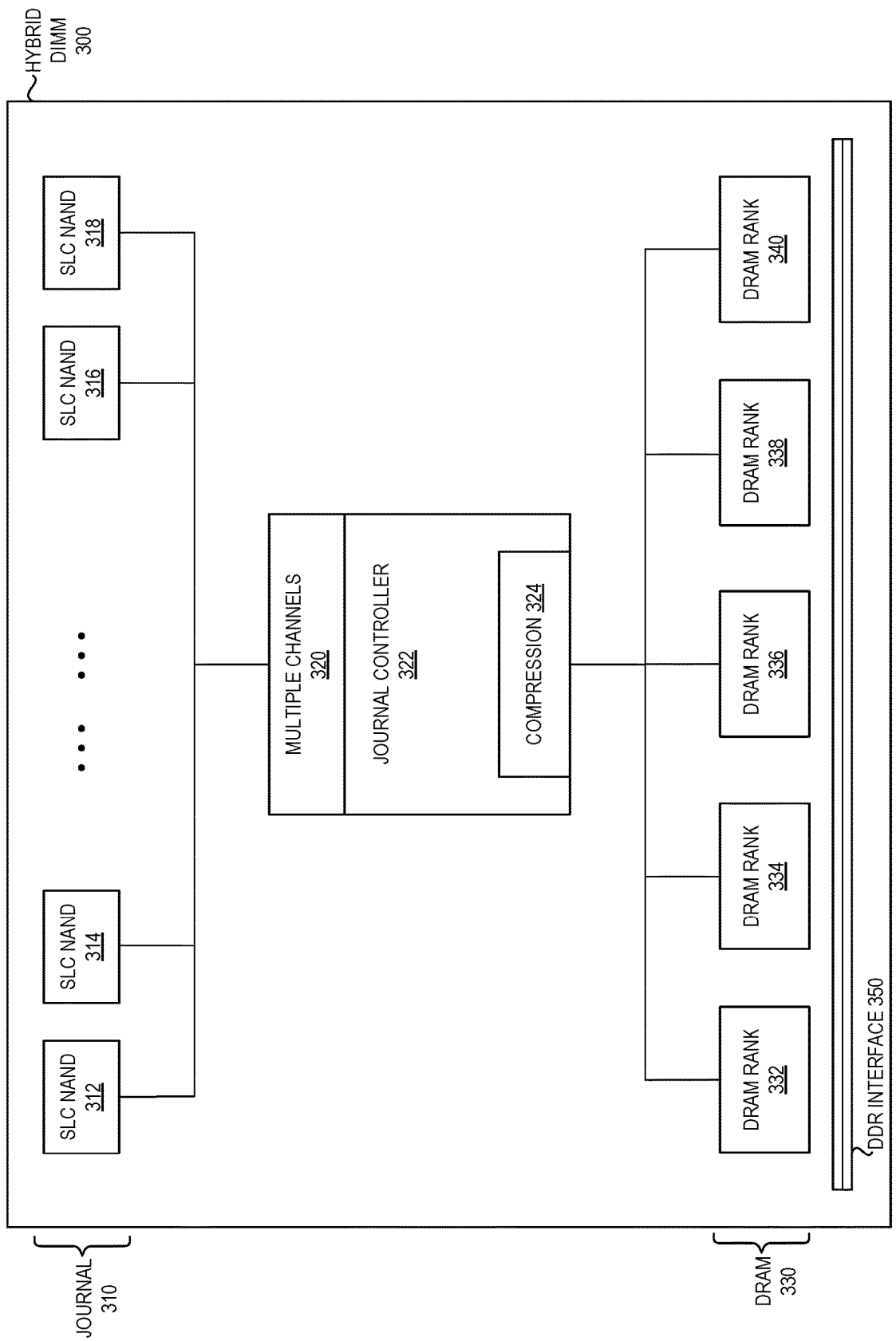
FIG. 3 illustrates an exemplary hybrid memory device which facilitates compression and journaling, in accordance with an embodiment of the present application.

FIG. 3 illustrates an exemplary hybrid memory device 300 which facilitates compression and journaling, in accordance with an embodiment of the present application. Hybrid memory device 300 can be a hybrid DIMM which can include: a DDR interface 350; DRAM 330, including DRAM ranks 332, 334, 336, 338, and 340; a journal controller 322 with a compression module 324; multiple channels 320; and journal storage 310, which can include non-volatile memory such as SLC NANDs 312, 314, 316, and 318. DRAM 330 can correspond to DRAM 206 of FIG. 2, journal controller 322 with compression module 324 can correspond to controller with compression 208 of FIG. 2, and journal 310 can correspond to journal storage 210 of FIG. 2.

Hybrid DIMM 300 can adopt a conventional DDR interface (as shown by DDR interface 350), which allows the memory device to remain compatible with known CPU protocols. Hybrid DIMM 300 can also expose the same DRAM capacity as in a conventional system. However, the controller of hybrid DIMM 300 (i.e., journal controller 322) can also access the data buffer portion of the DIMM. That is, journal controller 322 can access a data buffer region of DRAM ranks 332-240. Journal controller 322 can also integrate both the compression operation (as shown by compression module 324) and the EC functions (as described below in relation to FIG. 4), e.g., as assisted by hardware acceleration.

Recall that the journal drive may require high throughput. The described embodiments provide multiple channels 320 which can be active in parallel to accommodate the large amount of data involved in journaling (e.g., data which is handled or processed and stored in journal 310), as described below in relation to FIG. 4. In addition, the system can configure the non-volatile memory (NAND flash) of hybrid DIMM 300 in the single-level cell (SLC) mode to match the endurance and latency requirements of journal 310. That is, hybrid DIMM 300 can merge or integrate the journal drive to avoid the consumption of the PCIe bandwidth.

Exemplary Controller of a Hybrid Memory Device

Figure 4:
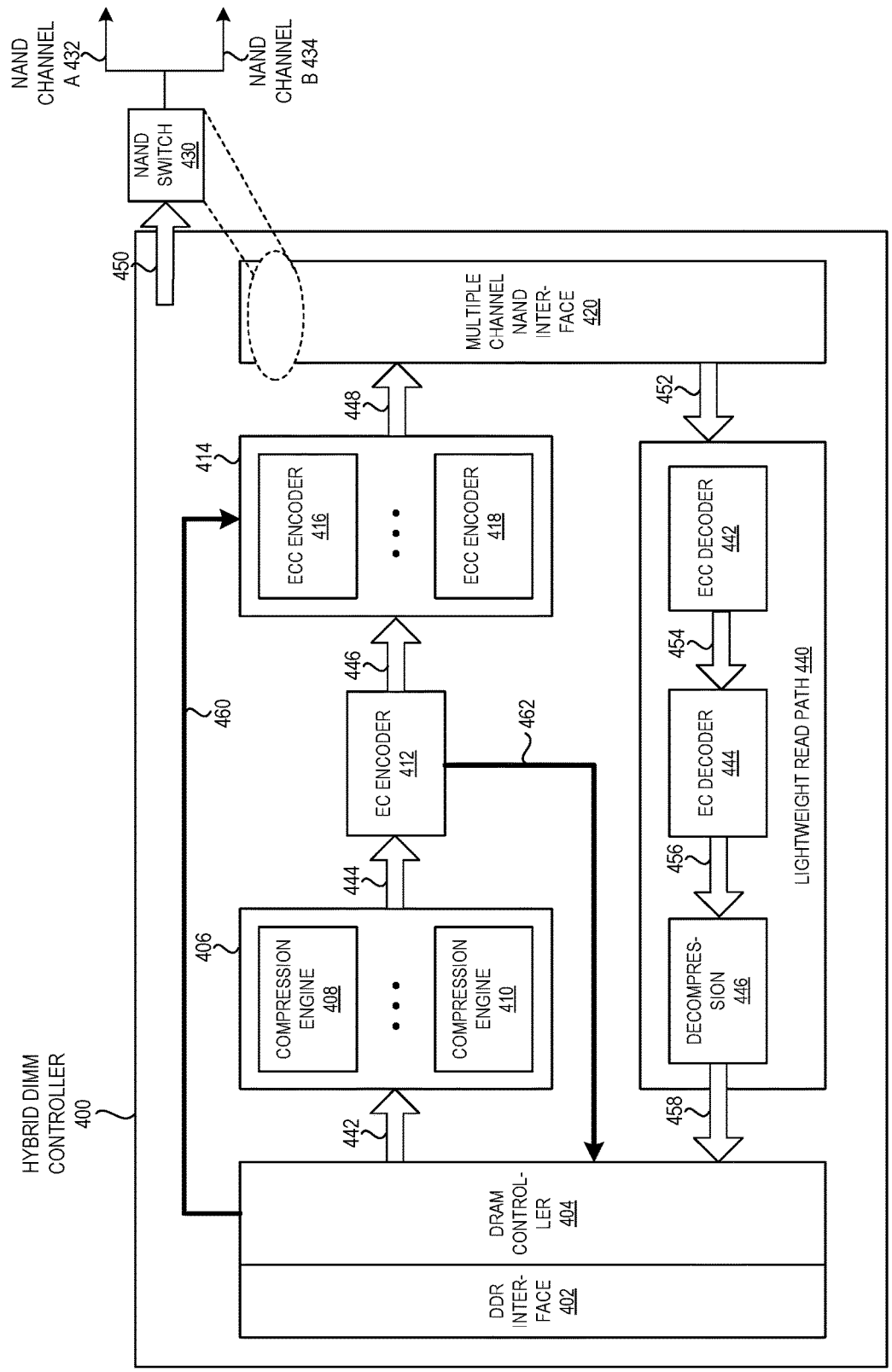
FIG. 4 illustrates an exemplary controller of a hybrid memory device which facilitates compression and journaling, in accordance with an embodiment of the present application.

FIG. 4 illustrates an exemplary controller 400 of a hybrid memory device which facilitates compression and journaling, in accordance with an embodiment of the present application. Controller 400 can include: a DDR interface 402; a DRAM controller 404; parallel compression engines 406, which can include compression engines 408 and 410; an EC encoder 412; ECC encoder module 410, which can include ECC encoders 416 and 418; and a multiple channel NAND interface 420.

During operation, a host or application can communicate with controller 400 via DDR interface 402, unlike in a conventional controller which may use a host interface. DRAM controller 404 can communicate with and manage DRAM in the hybrid DIMM which can serve as the system memory. This DRAM (not shown in FIG. 4; as described above in relation to DRAM ranks 332-340 of FIG. 3) can also serve as the data buffer for the controller, for data processing, e.g., compression/decompression, EC-encoding/decoding, ECC-encoding/decoding, etc. Controller 400 can read and write its DRAM through DRAM controller 404 and DDR interface 402. Parallel (and multiple) compression engines 406 (such as 408 and 410) can work simultaneously (i.e., at a same or similar time) to meet the throughput requirement, e.g., to compress any received data. Upon compressing any received data, EC encoder 412 can perform an erasure coding (EC) operation, to obtain EC-encoded data or an EC codeword. The system can divide the EC codeword into a plurality of parts, and determine to store a first part of the EC codeword in the local journal drive, while transmitting the remainder (parts) of the EC codeword to other servers based on a data placement rule or algorithm for the distributed storage system (via a communication 462). For the first part of the EC codeword to be stored in the local journal drive, the system can send this part to ECC encoder module 414 to be ECC-encoded (via a communication 446), and can subsequently write this ECC-encoded part to the non-volatile memory of the hybrid DIMM (via a communication 448 to multiple channel NAND interface 420.

In addition, hybrid DIMM controller 400 can receive at least one part of other compressed EC codewords for journaling and data storage. Because the received at least one part of the other compressed EC codewords has already undergone both compression and EC-encoding, hybrid DIMM controller 400 can bypass parallel compression engines 406 and EC encoder 412, and send the at least one part of the other compressed EC codewords to ECC encoder module 414 (via a communication 460). That is, the system, by hybrid DIMM controller 400, can send the received at least one part of the other compressed EC codewords to ECC encoder module 414 while bypassing parallel compression engines 406 and EC encoder 412.

The hybrid DIMM can include multiple channels, where each channel can include a NAND switch which allows a respective channel to serve as a plurality of channels by which to access the non-volatile memory of the hybrid DIMM. For example, multiple channel NAND interface 420 can include multiple channels, such as a channel 450, which can include a NAND switch 430. NAND switch 430 can provide a plurality of channels (such as two channels: a NAND channel A 432; and a NAND channel B 434) by which to access the non-volatile memory of the hybrid DIMM, e.g., SLC NAND flash memory. By using the NAND switches in this manner to increase the number of available channels via which to write data, the system can provide a backend channel which branches into several NAND channels for issuing a significant number of batches of write requests in a time measurement of a unit used to measure the latency. For example, a hybrid DIMM controller which communicates with or accesses a non-volatile memory can include 16 channels, where each channel can include a NAND switch which provides access to two NAND dies via two separate NAND channels. In this example, the NAND interface (e.g., multiple channel NAND interface 420) can double the number of available channels from 16 to 32 over which to write data to the non-volatile memory. This increase can result in an improved and more efficient system, in terms of both increased bandwidth and decreased access latency.

Thus, when writing the first part of the EC codeword in the local journal drive as well as the at least one part of the other compressed EC codewords (received by hybrid DIMM controller 400), the system can perform ECC-encoding and send the ECC-encoded part to the non-volatile memory, e.g., via a communication 448 to multiple channel NAND interface 420 and via, e.g., a communication 450 through NAND switch 430 to multiple NAND channels 432 and 434.

Note that controller 400 depicts a design which facilitates an improved and more efficient write operation, since write operations which are used to write data to the journal drive are generally more frequent than read operations which are used to retrieve data from the journal drive. As a result, the write path as depicted is designed to result in an increased bandwidth. The system can also include a lightweight read path 440 which does not need to account for a high frequency of operations, since read operations of the journal drive may occur only in the event of a fault for data recovery.

Lightweight read path 440 can include: an ECC decoder 442; an EC decoder 444; and a decompression module 446. During operation, the system can receive a request to read data stored in the non-volatile memory of the hybrid DIMM. The system can retrieve the requested data from the hybrid DIMM (specifically from a NAND flash via multiple channel NAND interface 420, via a communication 452). ECC decoder 442 can perform an ECC-decoding on the retrieved data. If the system determines that a recovery operation involving erasure code (EC)-decoding is to be performed on the ECC-decoded data, the system can transmit the ECC-decoded data to the EC decoder module (via a communication 454), which can perform an EC-decoding on the ECC-decoded data and send the EC-decoded data to decompression module 446 (via a communication 456). Subsequently, decompression module 446 can perform decompression on the EC-decoded (or on the ECC-decoded data if EC-decoding did not occur) to obtain decompressed data, and transmit the decompressed data back to a requesting host or application (via a communication 458).

Figure 5A:
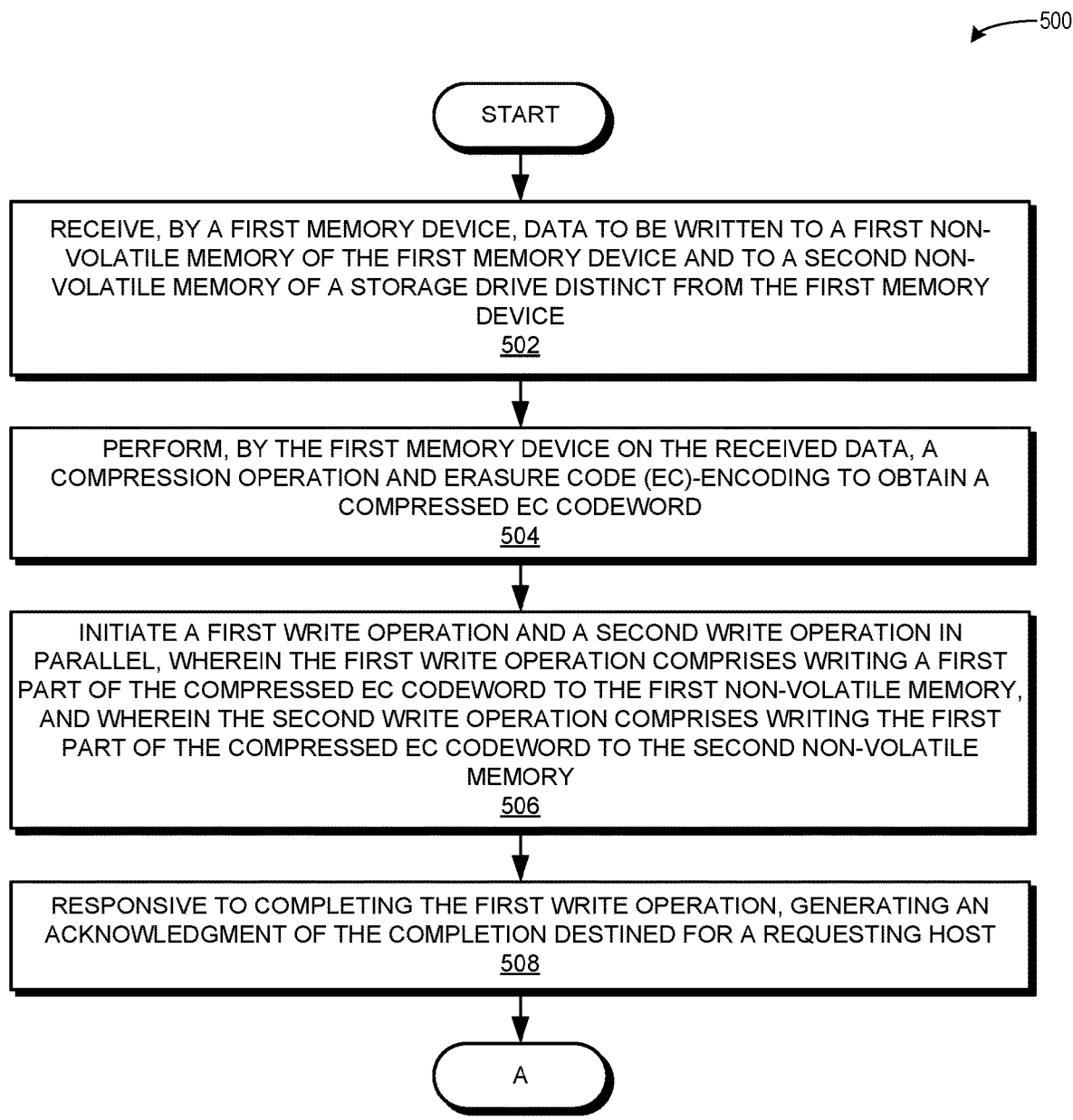
FIG. 5A presents a flowchart illustrating a method for facilitating journaling and data storage in a storage cluster, in accordance with an embodiment of the present application.

Exemplary Method for Facilitating Journaling and Data Storage in a Storage Cluster FIG. 5A presents a flowchart 500 illustrating a method for facilitating journaling and data storage in a storage cluster, in accordance with an embodiment of the present application. During operation, the system receives, by a first memory device, data to be written to a first non-volatile memory of the first memory device and to a second non-volatile memory of a storage drive distinct from the first memory device (operation 502). The system performs, by the first memory device on the received data, a compression operation and erasure code (EC)-encoding to obtain a compressed EC codeword (operation 504). The compression operation and EC-encoding operations can be performed by a controller of the first memory device.

The system initiates a first write operation and a second write operation in parallel, wherein the first write operation comprises writing a first part of the compressed EC codeword to the first non-volatile memory, and wherein the second write operation comprises writing the first part of the compressed EC codeword to the second non-volatile memory (operation 506). The system can write the first part of the compressed EC codeword to the first non-volatile memory by accessing, by the controller, the first non-volatile memory of the first memory device via a first interface which manages communication with the first non-volatile memory via multiple channels. A respective channel of the multiple channels includes a NAND switch which allows the respective channel to serve as a plurality of channels by which to access the first non-volatile memory, as described above in relation to FIG. 4. Responsive to completing the first write operation, the system generates an acknowledgment of the completion destined for a requesting host (or application) (operation 508). The operation continues at Label A of FIG. 5B.

Figure 5B:
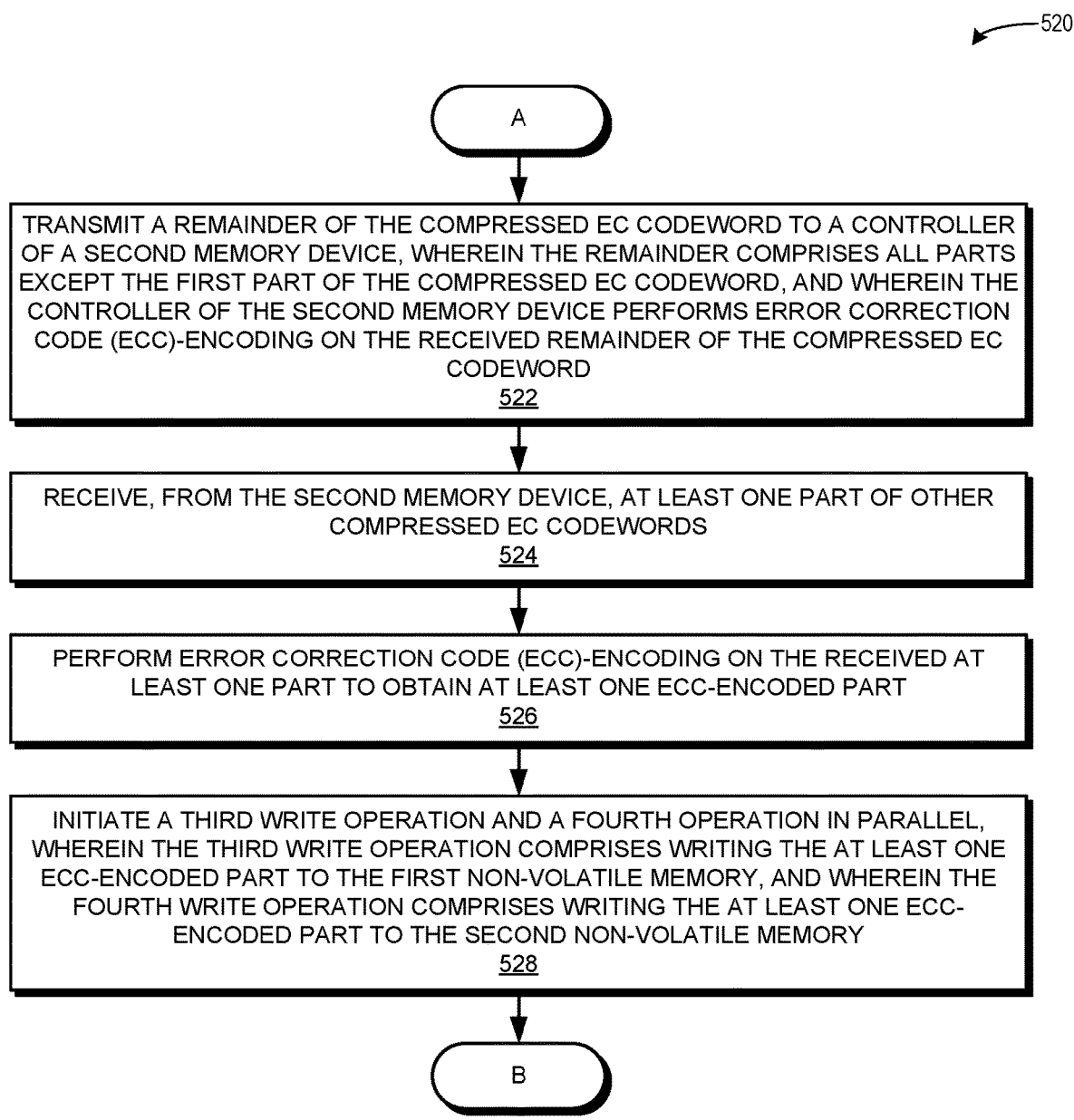
FIG. 5B presents a flowchart illustrating a method for facilitating journaling and data storage in a storage cluster, in accordance with an embodiment of the present application.

FIG. 5B presents a flowchart 520 illustrating a method for facilitating journaling and data storage in a storage cluster, in accordance with an embodiment of the present application. During operation, the system transmits a remainder of the compressed EC codeword to a controller of a second memory device, wherein the remainder comprises all parts except the first part of the compressed EC codeword, and wherein the controller of the second memory device performs error correction code (ECC)-encoding on the received remainder of the compressed EC codeword (operation 522). The system receives, from the second memory device, at least one part of other compressed EC codewords (operation 524). The system performs error correction code (ECC)-encoding on the received at least one part to obtain at least one ECC-encoded part (operation 526). The system initiates a third write operation and a fourth write operation in parallel, wherein the third write operation comprises writing the at least one ECC-encoded part to the first non-volatile memory, and wherein the fourth write operation comprises writing the at least one ECC-encoded part to the second non-volatile memory (operation 528). The operation continues at Label B of FIG. 5C.

Figure 5C:
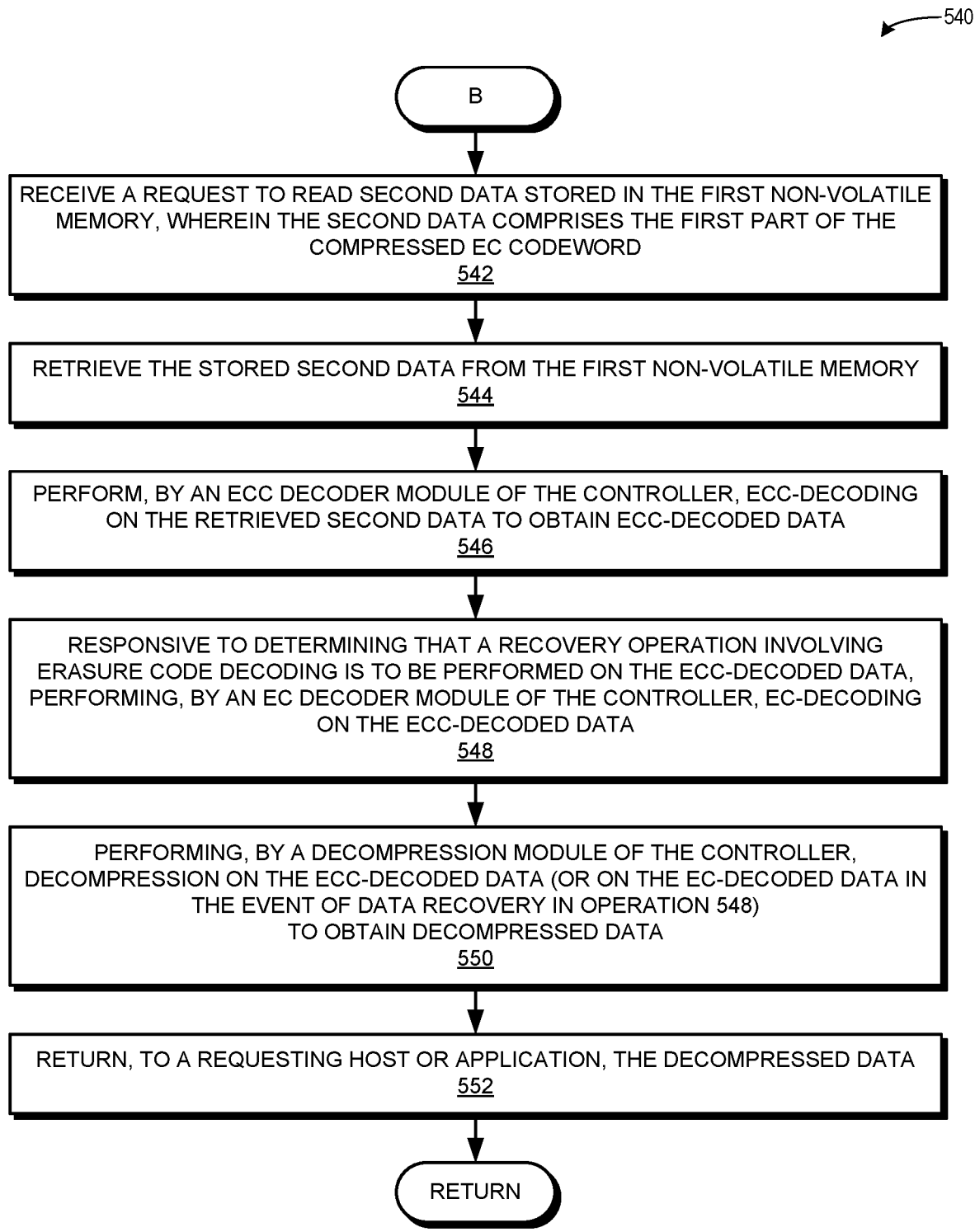
FIG. 5C presents a flowchart illustrating a method for facilitating journaling and data storage in a storage cluster, in accordance with an embodiment of the present application.

FIG. 5C presents a flowchart 540 illustrating a method for facilitating journaling and data storage in a storage cluster, in accordance with an embodiment of the present application. During operation, the system receives a request to read second data stored in the first non-volatile memory, wherein the second data comprises the first part of the compressed EC codeword (operation 542). The system retrieves the stored second data from the first non-volatile memory (operation 544). The system performs, by an ECC decoder module of the controller, ECC-decoding on the retrieved second data to obtain ECC-decoded data (operation 546). Responsive to determining that a recovery operation involving erasure code decoding is to be performed on the ECC-decoded data, the system performs, by an EC decoder module of the controller, EC-decoding on the ECC-decoded data (operation 548). The system performs, by a decompression module of the controller, decompression on the ECC-decoded data (or on the EC-decoded data in the event of data recovery) to obtain decompressed data (operation 550). The system returns, to a requesting host or application, the decompressed data (operation 552).

Thus, the described embodiments provide a distributed storage system in which a hybrid memory device (e.g., a hybrid DIMM) integrates the data buffer, the journal drive, compression operations, and erasure coding operations, where the integration can result in saving on the consumption of resources and bandwidth as well as reducing the latency involved in write operations associated with journal drives or journal data. The hybrid DIMM can provide a transparent collaboration with CPUs using known protocols, and the hybrid DIMM controller can provide an enhanced throughput which can match a high-speed network by reducing the amount of memory which is copied/transferred, increasing the parallelism of the write path, and accelerating the access to the non-volatile memory (e.g., NAND).

Exemplary Computer System and Apparatus

Figure 6:
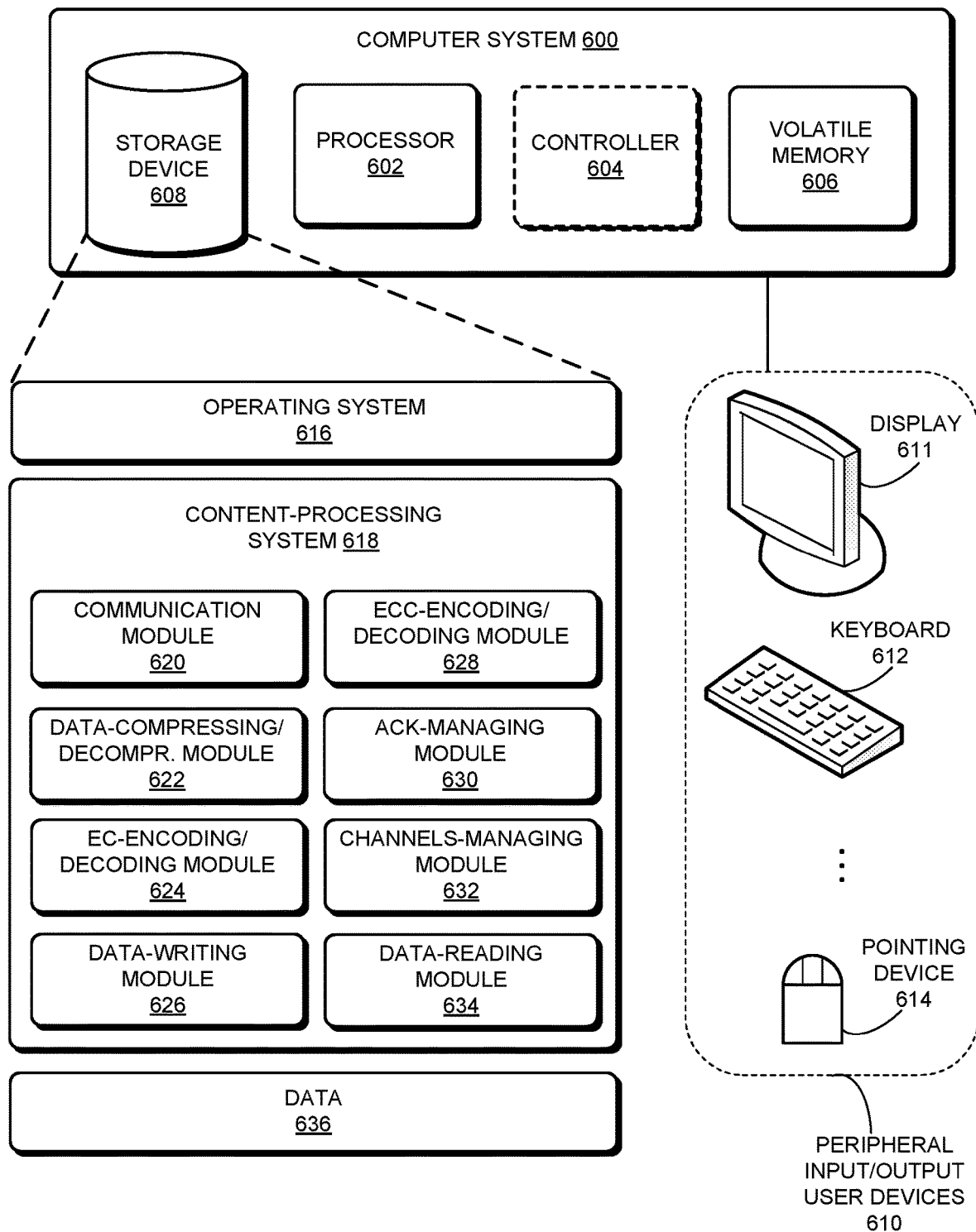
FIG. 6 illustrates an exemplary computer system that facilitates journaling and data storage in storage cluster, in accordance with an embodiment of the present application.

FIG. 6 illustrates an exemplary computer system 600 that facilitates journaling and data storage in storage cluster, in accordance with an embodiment of the present application. Computer system 600 includes a processor 602, a volatile memory 606, and a storage device 608. In some embodiments, computer system 600 can include a controller 604 (indicated by the dashed lines). Volatile memory 606 can include, e.g., random access memory (RAM), that serves as a managed memory, and can be used to store one or more memory pools. Storage device 608 can include persistent storage which can be managed or accessed via processor 602 (or controller 604). Furthermore, computer system 600 can be coupled to peripheral input/output (I/O) user devices 610, e.g., a display device 611, a keyboard 612, and a pointing device 614. Storage device 608 can store an operating system 616, a content-processing system 618, and data 636.

Content-processing system 618 can include instructions, which when executed by computer system 600, can cause computer system 600 or processor 602 to perform methods and/or processes described in this disclosure. Specifically, content-processing system 618 can include instructions for receiving and transmitting data packets, including data to be written or read, an EC codeword or part of an EC codeword, EC-encoded/decoded data, ECC-encoded/decoded data, compressed or decompressed data, and an input/output (I/O) request (e.g., a read request or a write request) (communication module 620).

Content-processing system 618 can further include instructions for receiving, by a first memory device, data to be written to a first non-volatile memory of the first memory device and to a second non-volatile memory of a storage drive distinct from the first memory device (communication module 620). Content-processing system 618 can include instructions for performing, by the first memory device on the received data, a compression operation and erasure code (EC)-encoding to obtain a compressed EC codeword (data compression/decompressing module 622 and EC-encoding/decoding module 624). Content-processing system 618 can also include instructions for initiating a first write operation and a second write operation in parallel, wherein the first write operation comprises writing a first part of the compressed EC codeword to the first non-volatile memory, and wherein the second write operation comprises writing the first part of the compressed EC codeword to the second non-volatile memory (data-writing module 626).

Content-processing system 618 can additionally include instructions for receiving, from a second memory device, at least one part of other compressed EC codewords (communication module 620). Content-processing system 618 can include instructions for performing error correction code (ECC)-encoding on the received at least one part to obtain at least one ECC-encoded part (ECC-encoding/decoding module 628). Content-processing system 618 can include instructions for initiating a third write operation and a fourth write operation in parallel (data-writing module 626).

Content-processing system 618 can also include instructions for responsive to completing the first write operation, generating an acknowledgment of the completion destined for a requesting host (acknowledgment-managing module 630). Content-processing system 618 can include instructions for accessing, by the controller, the first non-volatile memory of the first memory device via a first interface which manages communication with the first non-volatile memory via multiple channels, wherein a respective channel of the multiple channels includes a NAND switch which allows the respective channel to serve as a plurality of channels by which to access the first non-volatile memory (channels-managing module 632).

Content-processing system 618 can further include instructions for receiving a request to read second data stored in the first non-volatile memory, wherein the second data comprises the first part of the compressed EC codeword (communication module 620). Content-processing system 618 can include instructions for retrieving the stored second data from the first non-volatile memory (data-reading module 634). Content-processing system 618 can include instructions for performing, by an ECC decoder module of the controller, ECC-decoding on the retrieved second data to obtain ECC-decoded data (ECC-encoding/decoding module 628). Content-processing system 618 can include instructions for, responsive to determining that a recovery operation involving erasure code decoding is to be performed on the ECC-decoded data, performing, by an EC decoder module of the controller, EC-decoding on the ECC-decoded data (EC-encoding/decoding module 624). Content-processing system 618 can include instructions for performing, by a decompression module of the controller, decompression on the ECC-decoded data to obtain decompressed data (data-compressing/decompressing module 622). Content-processing system 618 can include instructions for returning, to a requesting host or application, the decompressed data (communication module 620).

Data 636 can include any data that is required as input or generated as output by the methods and/or processes described in this disclosure. Specifically, data 636 can store at least: data; a data block; a request; a read request; a write request; compressed or decompressed data; encoded or decoded data; EC-encoded or EC-decoded data; ECC-encoded or ECC-decoded data; an EC codeword; a first part and a remainder of an EC codeword; an indicator of a memory device or a storage device; an ECC-encoded or ECC-decoded part; an indicator or identifier of a controller of a memory device; an acknowledgment of a completion of a request; an indicator of multiple channels, one or more NAND switches, and an associated plurality of channels; an indicator of an interface, a volatile memory controller, parallel compression engines, an EC encoder/decoder modules, and an ECC encoder/decoder module; an indicator of SLC NAND flash memory; an initiation of a write operation; and an indicator or identifier of a PCIe bus.

Figure 7:
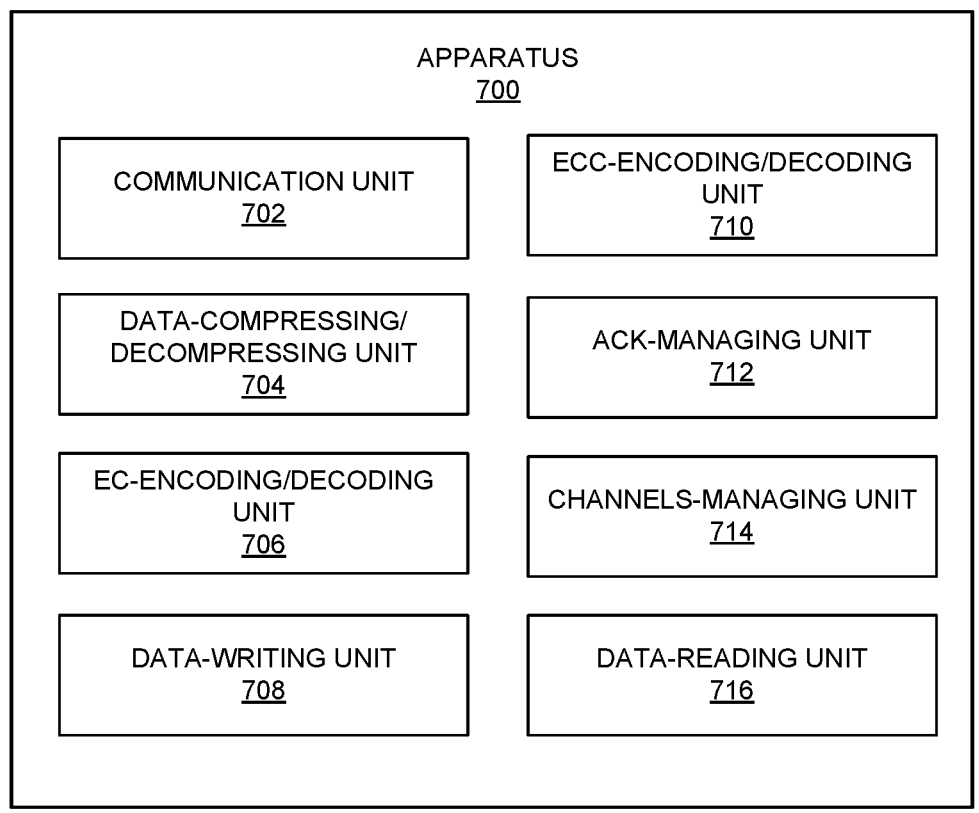
FIG. 7 illustrates an exemplary apparatus that facilitates journaling and data storage in a storage cluster, in accordance with an embodiment of the present application.

FIG. 7 illustrates an exemplary apparatus 700 that facilitates journaling and data storage in a storage cluster, in accordance with an embodiment of the present application. Apparatus 700 can comprise a plurality of units or apparatuses which may communicate with one another via a wired, wireless, quantum light, or electrical communication channel. Apparatus 700 may be realized using one or more integrated circuits, and may include fewer or more units or apparatuses than those shown in FIG. 7. Furthermore, apparatus 700 may be integrated in a computer system, or realized as a separate device or devices capable of communicating with other computer systems and/or devices.

Apparatus 700 can comprise modules or units 702-716 which are configured to perform functions or operations similar to modules 620-634 of computer system 600 of FIG. 6, including: a communication unit 702; a data-compressing/decompressing unit 704; an EC-encoding/decoding unit 706; a data-writing unit 708; an ECC-encoding/decoding unit 710; an acknowledgment-managing unit 712; a channels-managing unit 714; and a data-reading unit 716.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method, comprising:
receiving, by a first memory device, data to be written to a first non-volatile memory of the first memory device and to a second non-volatile memory of a storage drive distinct from the first memory device;
performing, by the first memory device on the received data, a compression operation and erasure code (EC)-encoding to obtain a compressed EC codeword; and
initiating a first write operation and a second write operation in parallel;
wherein the first write operation comprises writing a first part of the compressed EC codeword to the first non-volatile memory; and
wherein the second write operation comprises writing the first part of the compressed EC codeword to the second non-volatile memory.

2. The method of claim 1, further comprising:
receiving, from a second memory device, at least one part of other compressed EC codewords;
performing error correction code (ECC)-encoding on the received at least one part to obtain at least one ECC-encoded part; and
initiating a third write operation and a fourth write operation in parallel;
wherein the third write operation comprises writing the at least one ECC-encoded part to the first non-volatile memory; and
wherein the fourth write operation comprises writing the at least one ECC-encoded part to the second non-volatile memory.

3. The method of claim 2,
wherein the first memory device and the second memory device operate in a distributed storage system.

4. The method of claim 1, further comprising:
transmitting a remainder of the compressed EC codeword to a second memory device,
wherein the remainder comprises all parts except the first part of the compressed EC codeword,
wherein the remainder is received by a controller of the second memory device, and
wherein the controller of the second memory device performs error correction code (ECC)-encoding on the received remainder of the compressed EC codeword.

5. The method of claim 1, further comprising:
responsive to completing the first write operation, generating an acknowledgment of the completion destined for a requesting host.

6. The method of claim 1,
wherein the compression operation and EC-encoding are performed by a controller of the first memory device.

7. The method of claim 6,
wherein writing the first part of the compressed EC codeword to the first non-volatile memory comprises accessing, by the controller, the first non-volatile memory of the first memory device via a first interface which manages communication with the first non-volatile memory via multiple channels, and wherein a respective channel of the multiple channels includes a NAND switch which allows the respective channel to serve as a plurality of channels by which to access the first non-volatile memory.

8. The method of claim 7, wherein the controller comprises:
the first interface;
a second interface which manages communication with a host;
a volatile memory controller;
a plurality of parallel compression engines;
an erasure code (EC) encoder module; and
a plurality of error correction code (ECC) encoder modules.

9. The method of claim 6, further comprising:
receiving a request to read second data stored in the first non-volatile memory, wherein the second data comprises the first part of the compressed EC codeword;
retrieving the stored second data from the first non-volatile memory;
performing, by an ECC decoder module of the controller, ECC-decoding on the retrieved second data to obtain ECC-decoded data;
responsive to determining that a recovery operation involving erasure code decoding is to be performed on the ECC-decoded data, performing, by an EC decoder module of the controller, EC-decoding on the ECC-decoded data;
performing, by a decompression module of the controller, decompression on the ECC-decoded data to obtain decompressed data; and
returning, to a requesting host or application, the decompressed data.

10. The method of claim 1,
wherein the first non-volatile memory comprises single-level cell (SLC) Not-And (NAND) flash memory.

11. The method of claim 1, wherein initiating the first and second write operations comprises:
performing error correction code (ECC)-encoding on the first part of the compressed EC codeword to obtain an ECC-encoded first part;
wherein writing the first part of the compressed EC codeword to the first non-volatile memory comprises writing the ECC-encoded first part to the first non-volatile memory; and
wherein the first part of the compressed EC codeword is written to the second non-volatile memory of the storage via a Peripheral Component Interconnect Express (PCIe) bus.

12. A computer system, comprising:
a processor; and
a memory coupled to the processor and storing instructions which, when executed by the processor, cause the processor to perform a method, the method comprising:
receiving, by a first memory device, data to be written to a first non-volatile memory of the first memory device and to a second non-volatile memory of a storage drive distinct from the first memory device;
performing, by the first memory device on the received data, a compression operation and erasure code (EC)-encoding to obtain a compressed EC codeword; and
initiating a first write operation and a second write operation in parallel;

wherein the first write operation comprises writing a first part of the compressed EC codeword to the first non-volatile memory; and
wherein the second write operation comprises writing the first part of the compressed EC codeword to the second non-volatile memory.

13. The computer system of claim 12, wherein the method further comprises:
transmitting a remainder of the compressed EC codeword to a controller of a second memory device, wherein the remainder comprises all parts except the first part of the compressed EC codeword, and wherein the controller of the second memory device performs error correction code (ECC)-encoding on the received remainder of the compressed EC codeword;
receiving, from the second memory device, at least one part of other compressed EC codewords;
performing error correction code (ECC)-encoding on the received at least one part to obtain at least one ECC-encoded part; and
initiating a third write operation and a fourth write operation in parallel;
wherein the third write operation comprises writing the at least one ECC-encoded part to the first non-volatile memory; and
wherein the fourth write operation comprises writing the at least one ECC-encoded part to the second non-volatile memory.

14. The computer system of claim 12, wherein the method further comprises:
responsive to completing the first write operation, generating an acknowledgment of the completion destined for a requesting host.

15. The computer system of claim 12,
wherein writing the first part of the compressed EC codeword to the first non-volatile memory comprises accessing, by a controller of the first memory device, the first non-volatile memory of the first memory device via a first interface which manages communication with the first non-volatile memory via multiple channels, and
wherein a respective channel of the multiple channels includes a NAND switch which allows the respective channel to serve as a plurality of channels by which to access the first non-volatile memory.

16. The computer system of claim 15, wherein the controller comprises:
the first interface;
a second interface which manages communication with a host;
a volatile memory controller;
a plurality of parallel compression engines;
an erasure code (EC) encoder module; and
a plurality of error correction code (ECC) encoder modules.

17. The computer system of claim 12, wherein the method further comprises:
receiving a request to read second data stored in the first non-volatile memory, wherein the second data comprises the first part of the compressed EC codeword;
retrieving the stored second data from the first non-volatile memory;
performing, by an ECC decoder module of a controller of the first memory device, ECC-decoding on the retrieved second data to obtain ECC-decoded data;
responsive to determining that a recovery operation involving erasure code decoding is to be performed on the ECC-decoded data, performing, by an EC decoder module of the controller, EC-decoding on the ECC-decoded data;

performing, by a decompression module of the controller, decompression on the ECC-decoded data to obtain decompressed data; and returning, to a requesting host or application, the decompressed data.

18. The computer system of claim 12, wherein initiating the first and second write operations comprises:

performing error correction code (ECC)-encoding on the first part of the compressed EC codeword to obtain an ECC-encoded first part;

wherein writing the first part of the compressed EC codeword to the first non-volatile memory comprises writing the ECC-encoded first part to the first non-volatile memory; and wherein the first part of the compressed EC codeword is written to the second non-volatile memory of the storage via a Peripheral Component Interconnect Express (PCIe) bus.

19. A non-transitory computer-readable storage medium storing instructions that when executed by a computer cause the computer to perform a method, the method comprising:

receiving, by a first memory device, data to be written to a first non-volatile memory of the first memory device and to a second non-volatile memory of a storage drive distinct from the first memory device;

performing, by the first memory device on the received data, a compression operation and erasure code (EC)-encoding to obtain a compressed EC codeword; and initiating a first write operation and a second write operation in parallel;

wherein the first write operation comprises writing a first part of the compressed EC codeword to the first non-volatile memory; and wherein the second write operation comprises writing the first part of the compressed EC codeword to the second non-volatile memory.

20. The storage medium of claim 19, wherein the method further comprises:

transmitting a remainder of the compressed EC codeword to a controller of a second memory device, wherein the remainder comprises all parts except the first part of the compressed EC codeword, and wherein the controller of the second memory device performs error correction code (ECC)-encoding on the received remainder of the compressed EC codeword;

receiving, from a second memory device, at least one part of other compressed EC codewords;

performing error correction code (ECC)-encoding on the received at least one part to obtain at least one ECC-encoded part; and initiating a third write operation and a fourth write operation in parallel;

wherein the third write operation comprises writing the at least one ECC-encoded part to the first non-volatile memory; and wherein the fourth write operation comprises writing the at least one ECC-encoded part to the second non-volatile memory.

* * * * *